United States Patent
Ju

(10) Patent No.: US 9,406,397 B1
(45) Date of Patent: Aug. 2, 2016

(54) ANTI-FUSE NON-VOLATILE SEMICONDUCTOR MEMORY

(71) Applicant: Donghyuk Ju, Cupertino, CA (US)

(72) Inventor: Donghyuk Ju, Cupertino, CA (US)

( * ) Notice: Subject to any disclaimer, the term of this patent is extended or adjusted under 35 U.S.C. 154(b) by 0 days.

(21) Appl. No.: 14/664,779

(22) Filed: Mar. 20, 2015

(51) Int. Cl.
| H01L 29/00 | (2006.01) |
| G11C 17/16 | (2006.01) |
| G11C 17/18 | (2006.01) |
| H01L 27/112 | (2006.01) |
| H01L 23/525 | (2006.01) |
| H01L 29/49 | (2006.01) |
| H01L 23/528 | (2006.01) |

(52) U.S. Cl.
CPC ............... G11C 17/16 (2013.01); G11C 17/18 (2013.01); H01L 23/528 (2013.01); H01L 23/5252 (2013.01); H01L 27/11206 (2013.01); H01L 29/4916 (2013.01)

(58) Field of Classification Search
CPC .. G11C 17/16; G11C 17/18; H01L 27/11206; H01L 23/5252; H01L 29/4916; H01L 23/528
See application file for complete search history.

(56) References Cited

U.S. PATENT DOCUMENTS

| 6,611,040 | B2 | 8/2003 | Gelsomini et al. |
| 7,102,951 | B2 | 9/2006 | Paillet et al. |
| 7,110,278 | B2 | 9/2006 | Keshavarzi et al. |
| 7,678,620 | B2 | 3/2010 | Hoefler et al. |
| 7,755,162 | B2 * | 7/2010 | Kurjanowicz .......... G11C 17/16 257/288 |
| 8,213,211 | B2 | 7/2012 | Kurjanowicz et al. |
| 8,258,586 | B1 | 9/2012 | Mitchell et al. |
| 8,330,189 | B2 | 12/2012 | Luan et al. |
| 8,476,157 | B2 | 7/2013 | Lung |

* cited by examiner

Primary Examiner — Long Pham

(57) ABSTRACT

One-time programmable (OTP) memory comprises a layer of a first conductivity type formed in an active area in a region of a second conductivity type and gate polysilicon of a second conductivity type. Gate polysilicon and said layer of the first conductivity type act as the word line and the bit line. Each bit cell is picked up by a metal bit line. Contact between the metal bit line and said layer of the first conductivity type can be ohmic or rectifying. Said layer of the first conductivity type, said region of the second conductivity type and the contact, ohmic or rectifying, are formed by using process steps available from a standard manufacturing process.

17 Claims, 12 Drawing Sheets

US 9,406,397 B1

ANTI-FUSE NON-VOLATILE SEMICONDUCTOR MEMORY

CROSS-REFERENCE TO RELATED APPLICATIONS

Not Applicable

FIELD OF THE INVENTION

The present invention relates generally to semiconductor memory, and more specifically, to anti-fuse based embedded one-time programmable memory.

BACKGROUND OF THE INVENTION

An anti-fuse is an electronic device that is electrically non-conductive in its initial unprogrammed state and becomes electrically conductive when programmed. Programming of an anti-fuse is an irreversible process, i.e., once programmed, it remains in the conductive state and cannot be made to return to the non-conductive state. Silicon dioxide ($SiO_2$), gate dielectric used in metal-oxide-semiconductor field-effect transistors (MOSFET's), is one example of an anti-fuse material used in complementary MOS (CMOS) process, a mainstream manufacturing technology in semiconductor industry. When subjected to a high voltage, dielectric breakdown occurs in $SiO_2$ and a permanent current conduction path is formed through it. Those with ordinary skill in the art will recognize that other dielectric material, for example, nitrided silicon oxide (SiON) and high-k dielectric such as hafnium dioxide ($HfO_2$), can be used as anti-fuse.

Anti-fuse retains its electronic state, conductive or non-conductive, even after the power is turned off so it can be used as non-volatile memory. In contrast to other non-volatile memories such as erasable programmable read-only memory (EPROM), electrically-erasable programmable read-only memory (EEPROM) and flash memory that can be programmed and erased multiple times, an anti-fuse memory can be programmed only once, i.e., it is an one-time-programmable (OTP) memory. OTP memory is used in applications such as storing program code, security code and trimming of analog data. OTP memory may be a stand-alone product or embedded into other semiconductor chips, such as system-on-a-chip (SoC) where OTP memory functions as a data storage block.

System-on-a-chips are widely used in consumer, industrial and automotive electronics, and internet-of-things (IoT). For these applications, embedded OTP memory of high-performance and high-density with low cost is desired. OTP memory with crosspoint architecture, where each bit cell is defined at the intersection of a word line and a bit line, offers a small bit cell size and is capable of delivering high density memory at a low cost. To be cost-effective, it is desirable that OTP memory is fully compatible with the manufacturing process of the main chip that it is embedded into. An exemplary crosspoint anti-fuse OTP memory is shown in FIG. 1, a prior art found in U.S. Pat. No. 8,330,189 (FIG. 8 therein). It should be noted in FIG. 1 that the high bit-line series resistance caused by the buried bit-line structure may compromise program and read performance. Furthermore, the OTP memory in FIG. 1 requires extra wafer processing steps. It is therefore desired to provide an embedded anti-fuse OTP memory that offers high performance, high density and reliability that is fully compatible with standard wafer manufacturing processes.

BRIEF SUMMARY OF THE INVENTION

Anti-fuse OTP memory has a crosspoint architecture wherein each bit cell is accessed with a metal bit line through a contact to the bit line diffusion. Contact to the bit line diffusion can be ohmic or rectifying. If the contact is ohmic, cell is programmed in the accumulation mode. A programmed cell is read out by forward-biasing the diode. If the contact to the bit line diffusion is rectifying, cell is programmed in the inversion mode and a programmed cell is read out by operating the bipolar junction transistors in the forward active mode. The bit line diffusion is formed by an ion implantation step or a combination of ion implantation steps available in the standard wafer manufacturing processes. As a result, a cost-effective anti-fuse OTP memory with high performance, high density is realized.

DETAILED DESCRIPTION OF THE INVENTION

Figure 1:
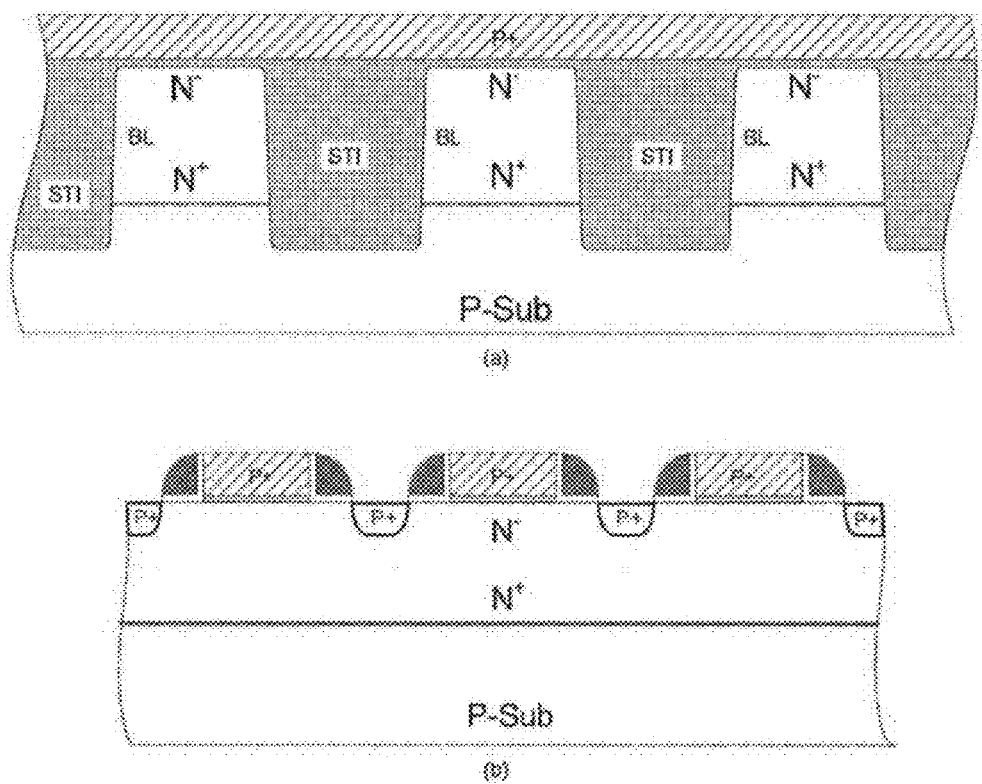
FIG. 1 is a cross-sectional view of an exemplary anti-fuse OTP memory found in the prior art.
Figure 2:
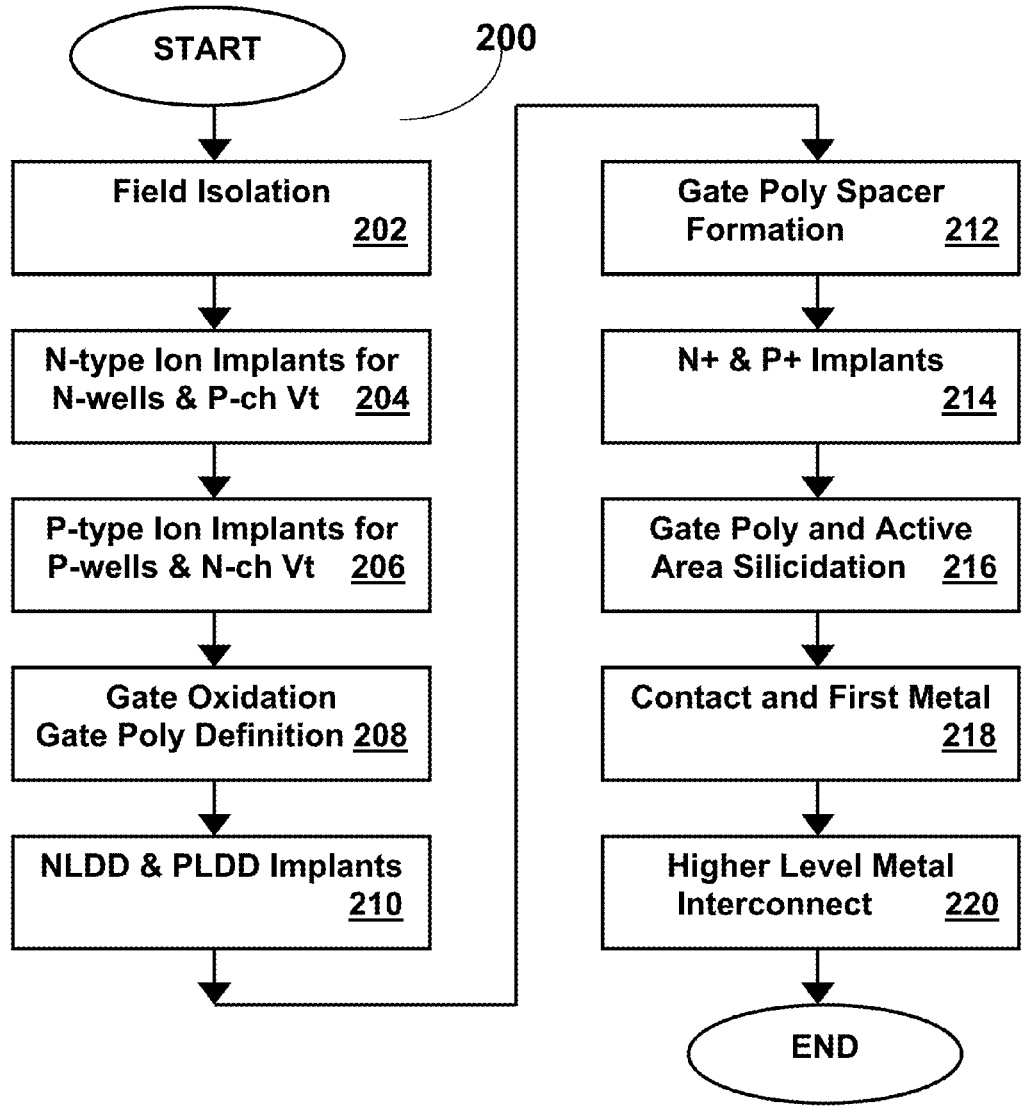
FIG. 2 is a flowchart of an exemplary standard CMOS fabrication process.

FIG. 2 is a flowchart describing salient steps of an exemplary standard CMOS fabrication process that may be used to produce the anti-fuse OTP memory disclosed in the present invention. The process flow 200 represents a process flow of major CMOS technologies such as logic, analog, mixed signal and high-voltage CMOS technologies. In FIG. 2, only those process steps deemed necessary for the description of the present invention are included. Other processing steps required to complete a CMOS process known to those with ordinary skill in the art are not shown and described so as to avoid unnecessary obfuscation. Further, whereas the salient steps of the fabrication process 200 are shown, depending on the circumstances some of the salient steps need not necessarily be performed, or, unless explicitly stated that one step precedes or follows another, may be performed in a different order than shown and described. The process steps in FIG. 2 will be referred to as necessary when the details of various embodiments of the present invention are described below.

Figure 3A:
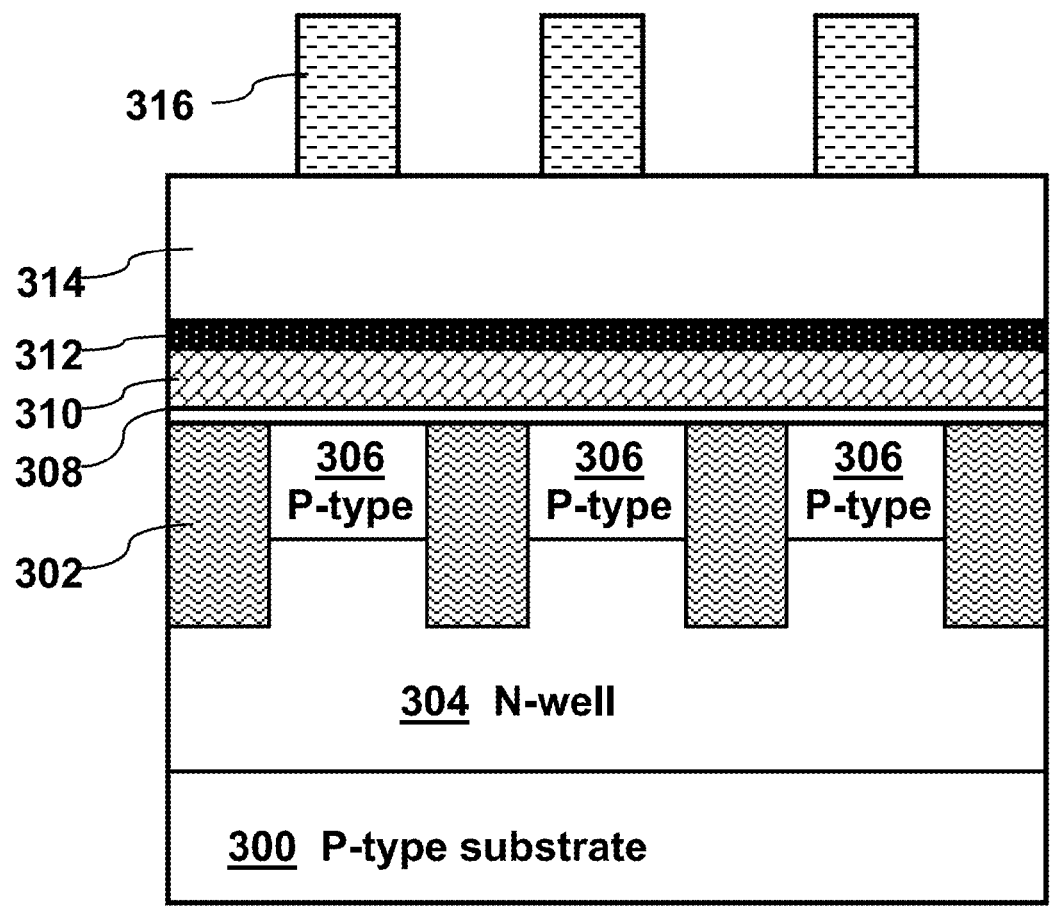
FIG. 3A and FIG. 3B are the cross-sectional views, cut along the word line direction and the bit line direction, respectively, of an exemplary embodiment of the present invention having an ohmic contact to the bit line diffusion.
Figure 3B:
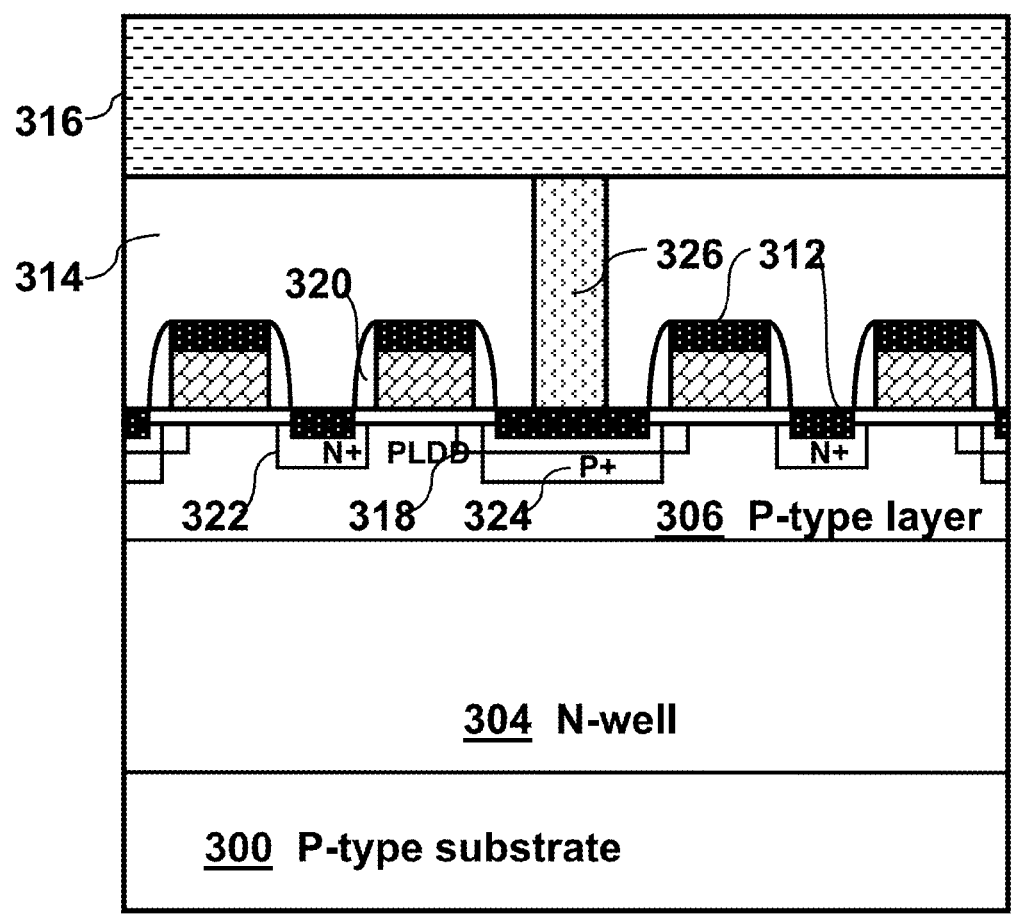

FIG. 3A is a cross-sectional view cut along the word line direction of an exemplary embodiment of the present invention. An important feature of FIG. 3A is a method of forming the N-well 304 and the P-type layer 306 by using process steps available in a standard CMOS process. In a CMOS process, a P-type silicon wafer 300 is commonly used as a starting material, which is also referred to as the substrate. Field isolation 302 is formed during the field isolation step 202 in FIG. 2. Field isolation 302 shown in FIG. 3A may be a shallow trench isolation (STI) or other types of isolation such as local oxidation of silicon (LOCOS). The area in which field isolation is not formed is herein referred to as the active area. Taking FIG. 3A as an example, the area where P-type layer 306 is formed is the active area. FIG. 3A also illustrates portions of N-well 304 are in the active area and the rest is in the field isolation area. On the other hand, the entire area in FIG. 3B is the active area because there is no field isolation in FIG. 3B. In a CMOS process, there may exist more than one N-well implant, each of which results in a different junction depth and doping profile. For example, a CMOS process can have a deep N-well for high-voltage devices and N-well for input/output (I/O) devices as well as N-well for core logic devices. N-well 304 in FIG. 3A is formed at the process step 204 in FIG. 2 using a single N-well implant or a combination of N-well implants available in the standard CMOS process. The junction depth of N-well 304 is typically one micrometer or more and is greater than the depth of field isolation 302, which is typically 0.3 micrometer to 0.4 micrometer in case of STI. The N-well 304 isolates P-type layer 306 from the substrate 300. The P-type layer 306 is the bit line diffusion and is formed at the process step 206 in FIG. 2. In CMOS technologies such as logic, analog, mixed signal and high-voltage CMOS, there may exist a number of P-type implants at step 206 in FIG. 2. The P-type implants available at step 206 in FIG. 2 include ion implants for P-well for core devices, P-well for I/O devices, threshold adjustment implants for low-voltage N-channel MOSFET's, high-voltage N-channel MOSFET's and for N-channel MOSFET's of static random access memory (SRAM). These available P-type implants, one or combination thereof, are used to create the P-type bit line diffusion 306. The P-type bit line diffusion 306 is shallower than the field isolation so that the neighboring bit line diffusions are isolated by field isolation 302. To prevent punch-through between adjacent bit lines during program, the junction depth of P-type bit line diffusion needs to be sufficiently smaller than the depth of field isolation, typically in the range of 0.1 micrometer to 0.2 micrometer.

Still referring to FIG. 3A, gate dielectric 308 is grown on the wafer followed by the deposition and patterning of polysilicon to define the gate poly 310 at process steps 208 in FIG. 2. A thin silicide film 312 is formed on top of the gate poly at the process step 216 in FIG. 2, followed by the deposition of inter-layer dielectric (ILD) 314 and the formation of first-level metal interconnect 316. Gate poly 310 and first-level metal 316 form the word line and bit line of the memory array, respectively.

FIG. 3B is a cross-sectional view cut along the bit line direction of an exemplary embodiment of the present invention. An important feature in FIG. 3B is a method of forming an ohmic contact to the P-type bit line diffusion 306 and doping the gate poly into heavily-doped N-type (N+) by using non-critical implant masks. Shown in FIG. 3B are the P-type substrate 300, N-well 304 and P-type layer 306, details of which were explained above with reference to FIG. 3A. The active area between the two middle word lines in FIG. 3B is exposed to ion implantation during P+ source/drain implant (step 214 in FIG. 2) while the rest of the area in FIG. 3B is blocked from it. During N+ source/drain implant, the active area between the two middle word lines in FIG. 3B is blocked from the implant while the rest of the area is exposed to it. As a result, a heavily doped P+ region 324 is formed in the P-type layer 306 between the two middle word lines. Two word line gate poly on the left and the active area between them are doped into N+. Likewise, two word line gate poly on the right and the active area between them are doped into N+. It should be noted N+ source/drain implant is performed after the gate sidewall spacer 320 is formed. Therefore N+ region 322 between the two word lines does not overlap with the word line poly because of an absence of N-channel lightly-doped drain (LDD) implant in the bit cell. This prevents the word line poly from getting shorted to N+ region 322 during programming. In the active area between the two middle word lines is shown a P-channel LDD region 318 as well as P+ region 324. Inclusion of a P-channel LDD region 318 in a bit cell, however, is optional. A contact 326 is formed in the P+ region 324, followed by the formation of the first-level metal interconnect 316, completing an OTP memory having an ohmic contact to each bit cell.

Figure 4:
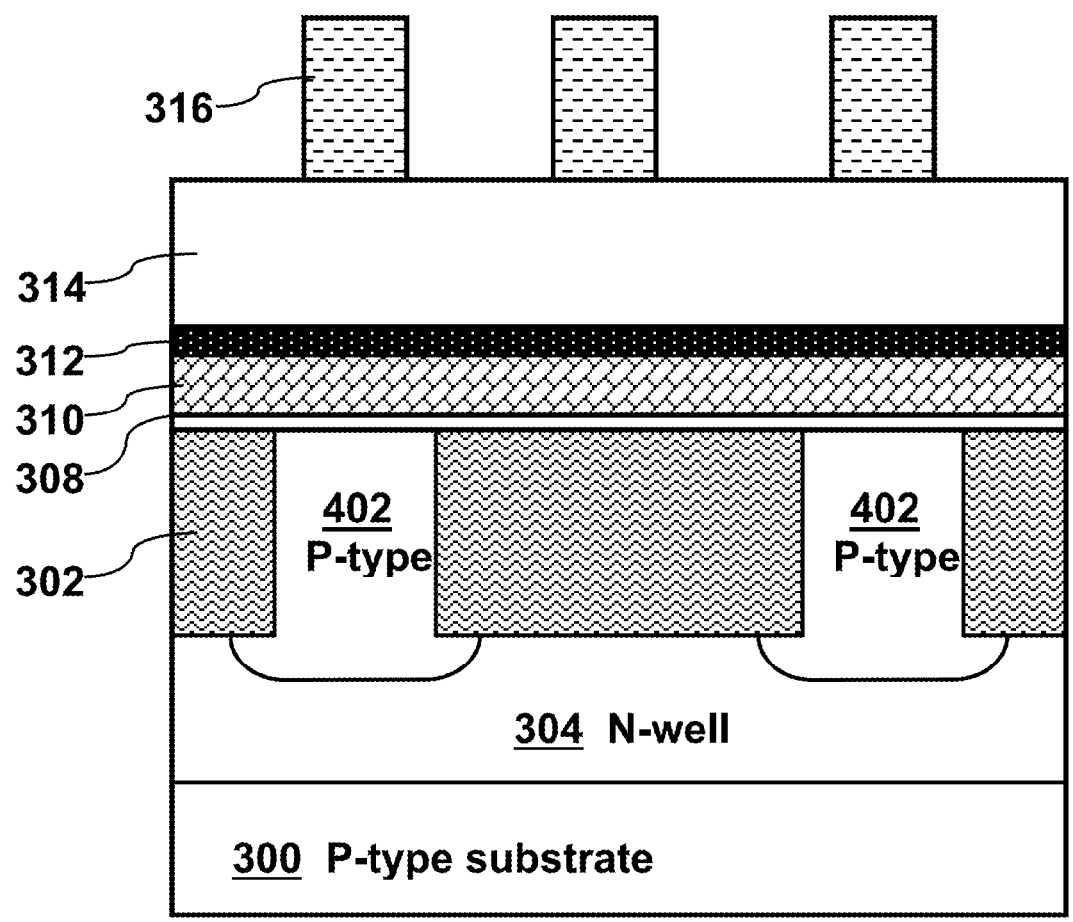
FIG. 4 is a cross-sectional view of one variation of an exemplary embodiment of the present invention shown in FIG. 3A.

FIG. 4 is a cross-sectional view of one variation of an exemplary embodiment of the present invention shown in FIG. 3A. In FIG. 4, P-type layer 402 is deeper than field isolation, and the electrical isolation between adjacent bit line diffusions is provided by junction isolation. P-type layer 402 can be used as a bit line diffusion for a low-density memory array.

Figure 5:
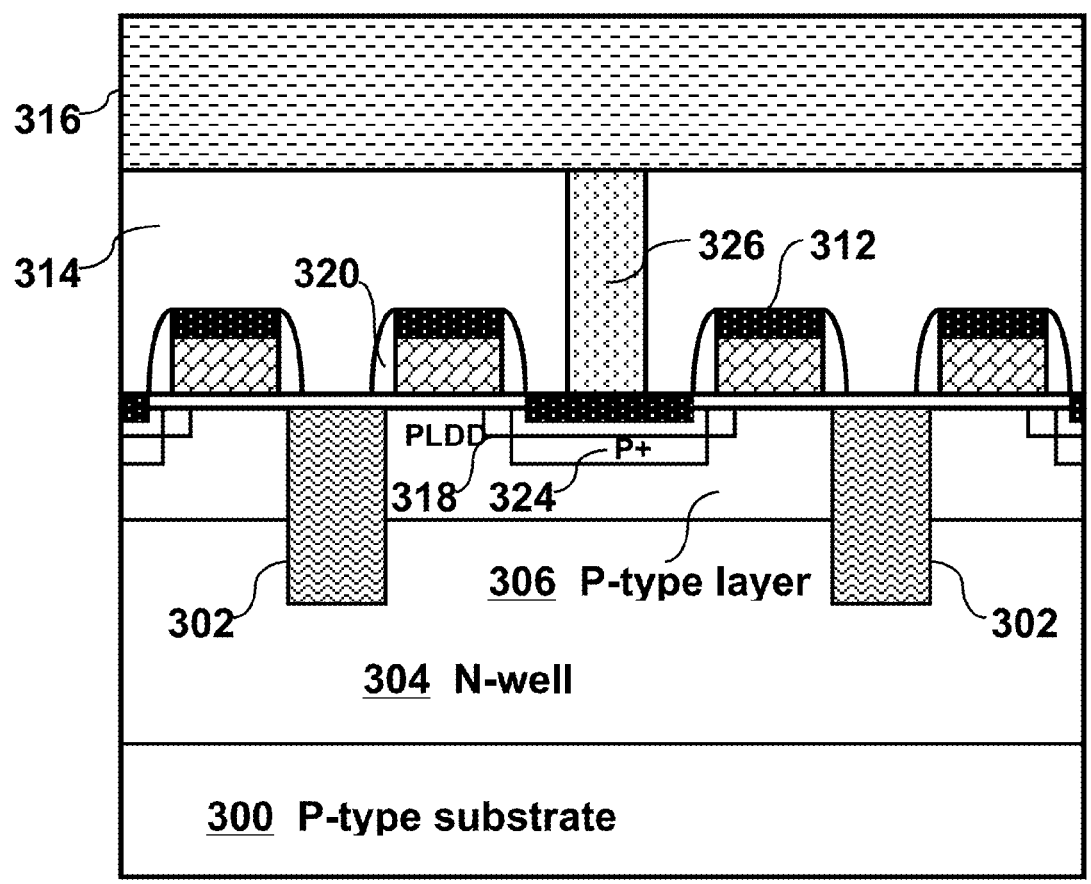
FIG. 5 is a cross-sectional view of one variation of an exemplary embodiment of the present invention shown in FIG. 3B.

FIG. 5 shows one variation of an exemplary embodiment of the present invention shown in FIG. 3B. In FIG. 5, field isolation is formed between the two narrowly-spaced word lines, thus eliminating N+ region 322 in FIG. 3B. FIG. 5 is advantageous because the possibility of leakage current between two adjacent word lines via floating N+ region 322 is eliminated.

Figure 6:
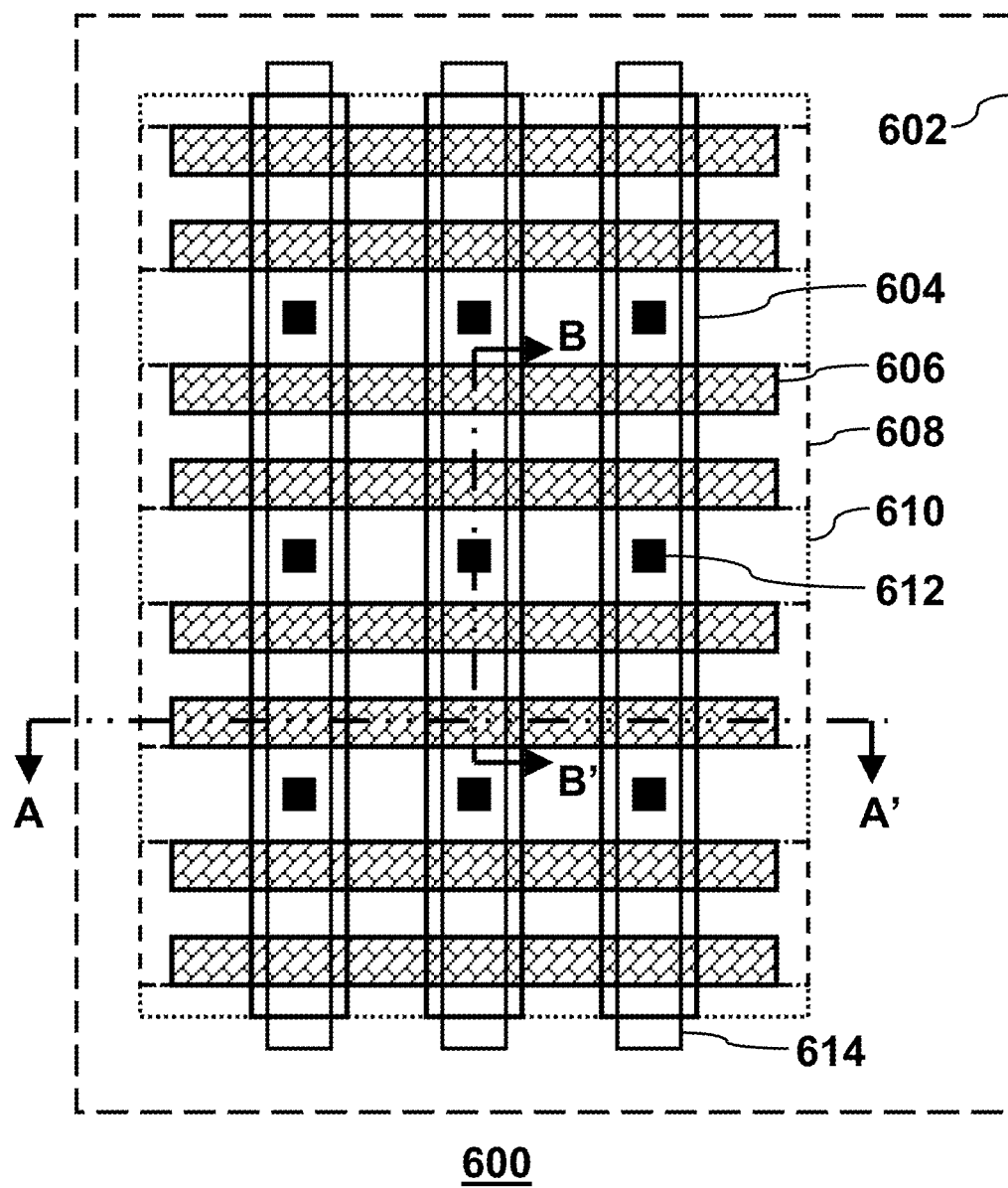
FIG. 6 is a top view of an anti-fuse OTP memory array according to one embodiment of the present invention.

Illustrated in FIG. 6 is a top view of an anti-fuse OTP memory array 600, according to one embodiment of the present invention. Cross-sectional views of FIG. 6 cut along the lines A-A' and B-B' are shown above in FIG. 3A and FIG. 3B, respectively. To avoid unnecessary obfuscation, only one of the identical features in FIG. 6 is shown with numbers from 604 through 614. The large rectangular area defined by 602 represents a mask pattern for N-type well implants and also P-type implants. The entire memory array sits inside the N-well defined by 602. The vertical stripe 604 defines an active area and is doped into a P-type layer by P-type implants, forming a bit line, as explained above in relation to FIG. 3A and FIG. 3B. The horizontal stripe 606 is the gate poly that acts as a word line. Each bit cell is formed at the intersection of a bit line 604 and a word line 606, resulting in a crosspoint array architecture. The rectangular feature 608 defines an area inside of which receives N+ source/drain implant, but not N-channel LDD implant. Consequently, the two gate poly lines and the active area between them become heavily doped N-type (N+) as shown in FIG. 3B. Since N-channel LDD implant is blocked from the memory array, N+ region 322 in FIG. 3B does not overlap with gate poly thus reducing the possibility of N+ region 322 getting shorted to gate poly as explained above. The rectangular area defined by 610 represents the mask pattern for P-channel LDD implant and P+ source/drain implant. The active area inside 610 becomes heavily doped P-type region (P+), shown as 324 in FIG. 3B. A contact hole 612 is formed inside the P+ region and is connected to the metal bit line 614. It should be noted that N+ source/drain implant mask pattern 608 and the mask pattern 610 for P-channel LDD implant and P+ source/drain implant have feature and spacing dimensions greater than the minimum design rule. As a result, non-critical masks can be used at these implant steps which is advantageous in terms of manufacturing cost.

It is to be noted the orientation of word lines with respect to bit lines employed herein is for illustration purpose only. Those with ordinary skill in the art will recognize the word line and bit line may be laid out 90 degrees rotated, i.e., word line in the vertical direction and bit line in the horizontal direction. It should also be noted that the dimensions, horizontal and vertical, of the various parts of the anti-fuse OTP memory in the drawings of this disclosure, including the thickness of its various layers, depth and lateral reach of its doped regions are not necessarily drawn to scale. In some cases, layer thickness, junction depths, lengths and widths and other dimensions are exaggerated so as to best illustrate the structural features and/or functional aspects of the present invention.

Figure 7A:
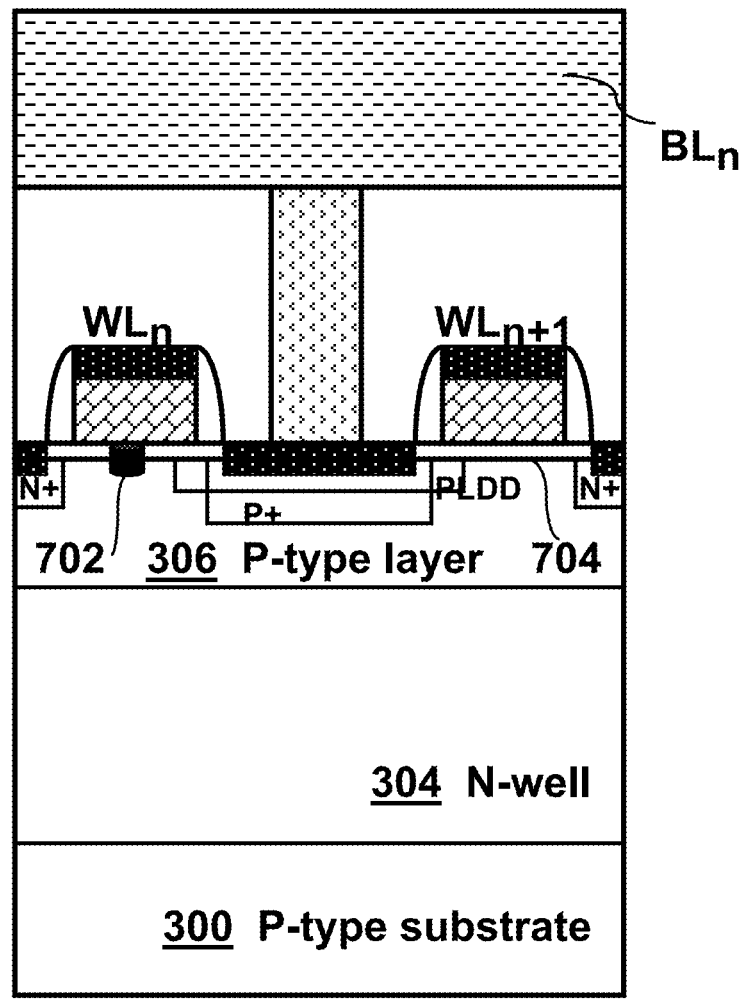
FIG. 7A is a cross-sectional view of one programmed cell and one unprogrammed cell having an ohmic contact to the bit line diffusion according to an exemplary embodiment of the present invention shown in FIG. 3A and FIG. 3B.
Figure 7B:
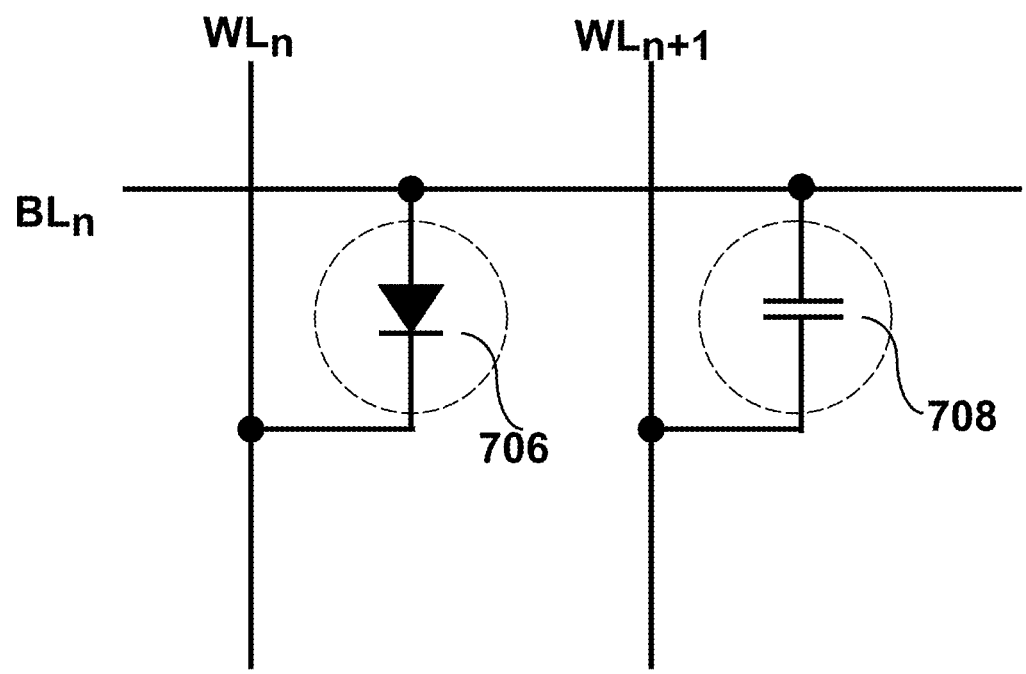
FIG. 7B is a schematic representation of FIG. 7A.

FIG. 7A shows a cross-sectional drawing of two bit cells sharing a bit line contact, one defined by the word line $WL_n$ and the bit line $BL_n$ and the other defined by $WL_{n+1}$ and $BL_n$. Otherwise, FIG. 7A is identical to FIG. 3B, which has four bit cells in the drawing. The cell defined by $WL_n$ and $BL_n$ in FIG. 7A represents a programmed cell, wherein a protrusion 702 of N+ gate poly into P-type layer 306 through a ruptured gate dielectric is shown. The N-type protrusion 702 forms a diode with P-type layer 306 underneath, which is represented as a diode 706 in a schematic drawing FIG. 7B. The cell defined by $WL_{n+1}$ and $BL_n$, 704 in FIG. 7A represents an unprogrammed cell and is schematically represented as a MOS capacitor 708 in FIG. 7B.

Referring to FIG. 7A, programming a bit cell is accomplished by applying appropriate voltage pulses to selected word line and bit line to drive the selected MOS capacitor into the accumulation mode. One exemplary method of programming an unprogrammed cell is to apply a voltage pulse with an amplitude of $-(½)*VPP$ to $WL_{n+1}$ and to apply simultaneously a voltage pulse with an amplitude of $(½)*VPP$ to $BL_n$, where VPP is the positive total voltage required to program a cell. Unselected word lines and bit lines are biased to $(½)*VPP$ and $-(½)*VPP$, respectively. During programming, a positive voltage equal to or greater than $(½)*VPP$ is applied to N-well 304 to prevent P-type layer 306 from becoming forward-biased with respect to N-well. To read a programmed cell, the cell defined by $WL_n$ and $BL_n$ in FIG. 7A for example, a positive voltage VRD is applied to the selected bit line $BL_n$ while the selected word line $WL_n$ is grounded. The diode 706 in FIG. 7B becomes forward biased and the current flowing into the selected bit line is sensed by the sensing circuit. During a read operation, unselected bit lines are kept at 0V and unselected word lines are biased to a voltage equal to or greater than VRD. This ensures the diodes in the unselected programmed cells to be reverse biased. As an example, VRD is 1V and the bias voltage to the unselected world lines may be 1.8V. Those with ordinary skill in the art will recognize there are other possible ways of applying voltages to word lines, bit lines and N-well for program and read.

Figure 8:
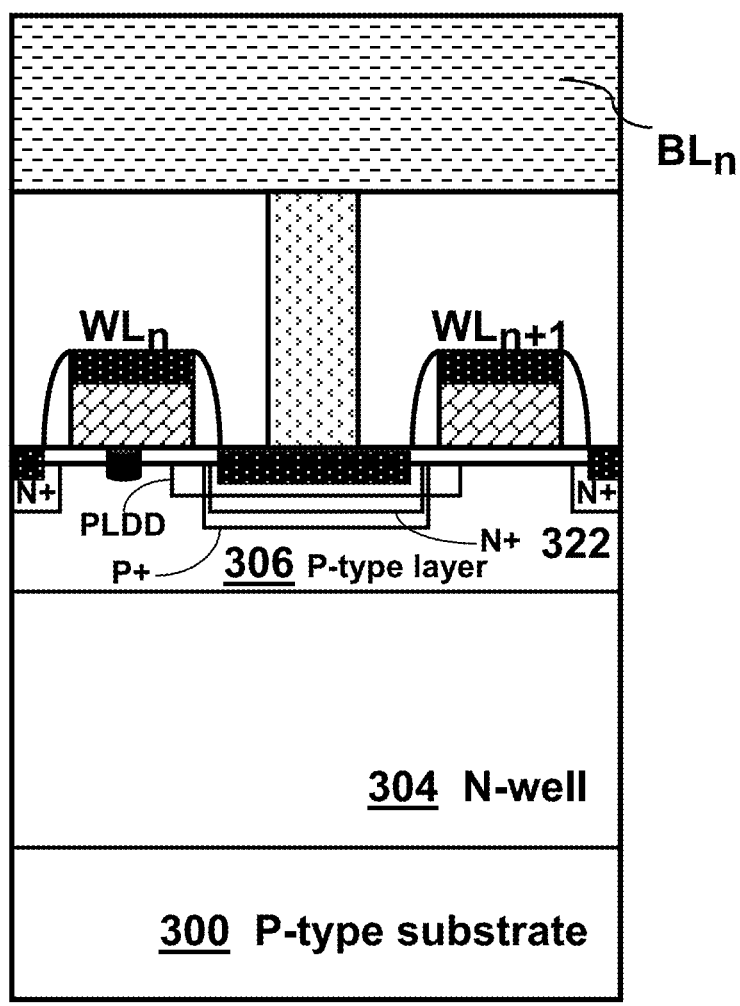
FIG. 8 is a cross-sectional view according to another embodiment of the present invention having an ohmic contact to the bit line diffusion.

FIG. 8 is a cross-sectional drawing of an OTP memory according to another embodiment of the present invention. In FIG. 8, in addition to P+ and an optional P-channel LDD regions shown in FIG. 7A, there exists an N+ region 322 in the active area where a bit line contact is formed. Otherwise, FIG. 8 is identical to FIG. 7A. It is well known that in a PN junction where both sides of the junction are heavily doped, current flows easily in either direction due to the tunneling mechanism. Hence, a tunneling junction exhibits an ohmic characteristic. The active area between the two word lines in FIG. 8 is heavily doped with P+ and N+ implants, resulting in a tunneling junction. Consequently, an ohmic contact is established to the P-type bit line diffusion 306 and FIG. 8 becomes schematically identical to FIG. 7B. FIG. 8 is advantageous because it allows the use of a large block pattern 602, instead of the narrow stripe 608, on the N+ source/drain implant mask, alleviating potential constraints associated with the narrow stripe pattern 608.

Figure 9A:
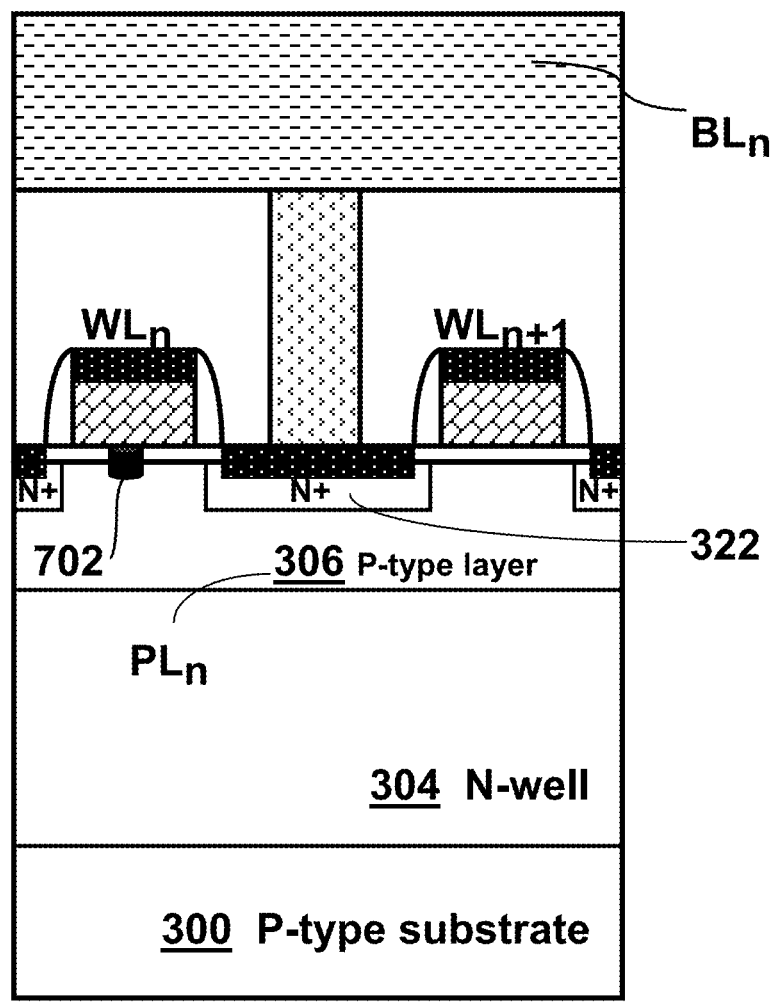
FIG. 9A is a cross-sectional view of one programmed cell and one unprogrammed cell having a rectifying contact to the bit line diffusion according to an exemplary embodiment of the present invention.
Figure 9B:
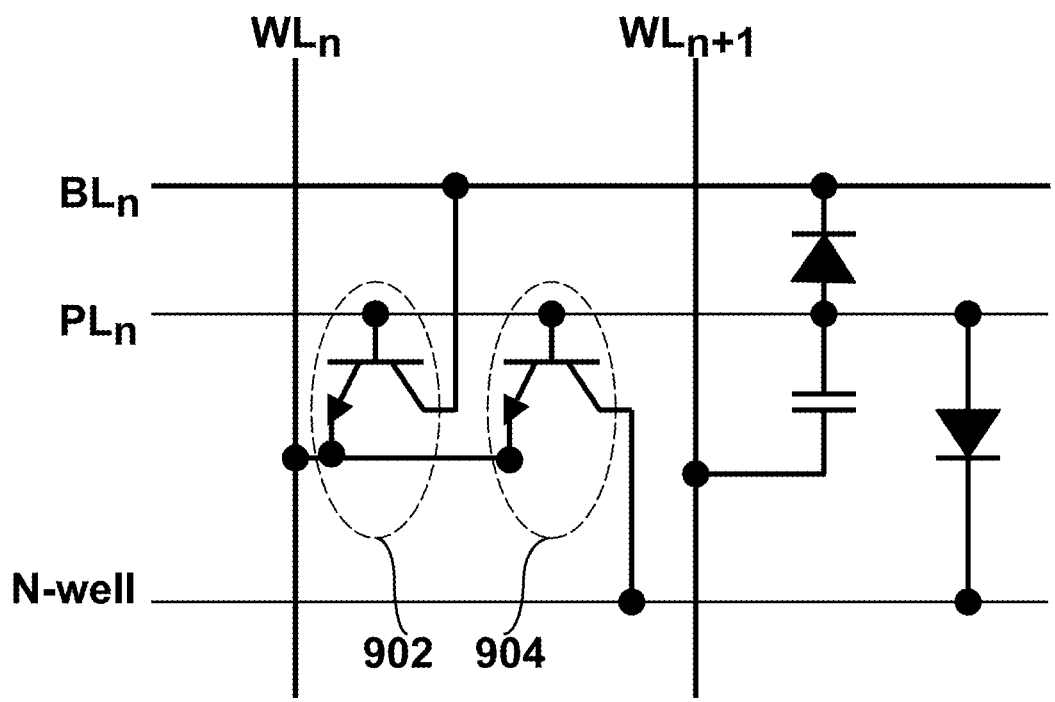
FIG. 9B is a schematic representation of FIG. 9A.

FIG. 9A is a cross-sectional drawing of an OTP memory according to yet another embodiment of the present invention. In FIG. 9A, N+ source/drain implant is performed over the entire memory array using a large block mask pattern 602. Furthermore, P-channel LDD and P+ implants are blocked from the memory array as well as N-channel LDD implant. Therefore, only the N+ region 322 is present in the active area between the word line gate poly. As a result, a rectifying PN junction, instead of an ohmic contact, is formed with the P-type bit line diffusion 306. FIG. 9B is a schematic representation of FIG. 9A for one programmed cell and one unprogrammed cell sharing a bit line contact. The memory cell associated with $WL_n$ and $BL_n$ in FIG. 9A represents a programmed cell and is schematically represented by two NPN bipolar junction transistors (BJTs) 902 and 904 in FIG. 9B. The NPN BJT 902 in FIG. 9B represents the lateral BJT in FIG. 9A formed by N-type protrusion 702 (emitter), P-type layer 306 (base) and N+ region 322 (collector). The NPN BJT 904 in FIG. 9B represents the vertical BJT in FIG. 9A formed by N-type protrusion 702 (emitter), P-type layer 306 (base) and N-well 304 (collector). It is to be noted that in FIG. 9A and FIG. 9B, P-type layer 306 acts as the base of both lateral and vertical BJT's. It is also to be noted that P-type layer 306 is labeled as $PL_n$ to distinguish it from the external metal bit line $BL_n$ which acts as the collector of the lateral BJT 902. Referring back to FIG. 9A, the contacts to pick up P-type layer, not shown in the drawing, are provided as often as necessary to maintain high performance and high density of the memory array.

An exemplary method of programming an unprogrammed cell in FIG. 9A involves applying a positive voltage VPP to the selected word line $WL_{n+1}$ and applying 0V to the selected bit line $BL_n$ and also to the selected P-type layer $PL_n$. Under this bias condition, an inversion layer is formed under the gate dielectric of the selected MOS capacitor and the programming current is supplied from the metal bit line $BL_n$ through N+ region 322. During programming, unselected word lines are biased to a voltage lower than VPP, for example $(½)*VPP$. Unselected bit lines and P-type layers are also biased to $(½)*VPP$ and N-well is biased to VPP.

Referring to FIG. 9B, to read a programmed cell, the selected word line $WL_n$ is grounded and a positive voltage VPL that is sufficiently high to forward bias the base-emitter diode but is lower than the power supply voltage VDD is applied to the selected P-type layer $PL_n$. A positive voltage VBL that is higher than VPL, for example VDD, is applied to the selected bit line $BL_n$ and also to N-well. Under this bias condition, both BJT's 902 and 904 operate in the forward active mode. The cell can be read out by sensing the current flowing out of $WL_n$ or into $BL_n$. During read, unselected word lines are biased to a voltage higher than VPL, for example VDD, and unselected metal bit lines and P-type layers are grounded to ensure reverse bias of the diodes in the unselected cells.

In scaled-down CMOS technologies wherein the lateral dimension from the gate protrusion 702 in FIG. 9A to N+ region 322 is small, a punch-through can occur from the collector 322 to the emitter 702 of the lateral BJT. In such a case, a read operation can be performed by grounding the selected word line $WL_n$, grounding or floating the P type-layer 306 and by applying a positive voltage to the selected metal bit line $BL_n$. The resulting punch-through current can be read either from the selected word line $WL_n$ or the selected bit line $BL_n$. Unselected word lines are left floating and unselected bit lines and P-type layers are grounded during read.

While various embodiments of the present invention have been described, it should be understood that they have been presented by way of example, and not limitation. It will be apparent to persons skilled in the relevant art that various changes in form and detail may be made therein without departing from the spirit and scope of the invention. The scope of the invention should, therefore, be determined not with reference to the above description, but instead by reference to the appended claims, along with the full scope of equivalents to which such claims are entitled.

What is claimed is:

1. An One-time programmable (OTP) semiconductor memory cell comprising:
    a layer of a first conductivity type formed in an active area in a region of a second conductivity type, a dielectric layer formed on said layer of the first conductivity type, a gate conductor layer of the second conductivity type formed on said dielectric layer, dielectric spacers formed on the sidewalls of said gate conductor layer, silicide formed on said layer of the first conductivity type and gate conductor layers, and contacts formed to said layer of the first conductivity type to provide access to each bit cell with metal interconnects, wherein said layer of the first conductivity type is the bit line diffusion, metal interconnect connected to said layer of the first conductivity type through a contact is the bit line and said gate conductor layer is the word line.

2. The OTP memory cell of claim 1 wherein said first conductivity type is P-type, said second conductivity type is N-type; and vice versa.

3. The OTP memory cell of claim 1 wherein said layer of the first conductivity type is formed by a single ion implantation or a combination of ion implantations available in a standard manufacturing process.

4. The OTP memory cell of claim 1 wherein said region of the second conductivity type is formed by a single ion implantation or a combination of ion implantations available in a standard manufacturing process.

5. The OTP memory cell of claim 1 wherein the metal bit line makes an ohmic contact to said layer of the first conductivity type through a heavily-doped region of the first conductivity type formed in the contacted area.

6. The OTP memory cell of claim 5 wherein a cell is programmed in an accumulation mode and the readout of a programmed cell is carried out by forward-biasing the diode.

7. The OTP memory cell of claim 1 wherein the metal bit line makes an ohmic contact to said layer of the first conductivity type through a region heavily-doped in both the first and the second conductivity types formed in the contacted area.

8. The OTP memory cell of claim 7 wherein a cell is programmed in an accumulation mode and the readout of a programmed cell is carried out by forward-biasing the diode.

9. The OTP memory cell of claim 1 wherein the metal bit line makes a rectifying contact to said layer of the first conductivity type through a heavily-doped region of the second conductivity type formed in the contacted area.

10. The OTP memory cell of claim 9 wherein a cell is programmed in an inversion mode by applying a positive voltage to the selected word line with reference to the selected metal bit line and said layer of the first conductivity type.

11. The OTP memory cell of claim 9 wherein the readout of a programmed cell is carried out by forward-biasing the emitter-base junction of the lateral bipolar junction transistor (BJT) comprising the word line poly, said layer of the first conductivity type and the heavily doped region of the second conductivity type formed in the contacted area, and of the vertical BJT comprising the word line poly, said layer of the first conductivity type and said region of the second conductivity type, thereby operating the lateral and vertical BJT's in the forward active mode.

12. The OTP memory cell of claim 9 wherein the readout of a programmed cell is carried out by a collector-to-emitter punch-through of the lateral BJT comprising the word line poly, said layer of the first conductivity type and the heavily doped region of the second conductivity type formed in the contacted area.

13. The OTP memory cell of claim 1 wherein the contacted area in said layer of the first conductivity type is doped into the first and/or second conductivity type and non-contacted area in said layer of the first conductivity type is doped into the second conductivity type.

14. The OTP memory cell of claim 1 wherein the contacted area in said layer of the first conductivity type is doped into the first and/or second conductivity type and field isolation is placed between word lines where contacts are not formed.

15. The OTP memory cell of claim 1 wherein said layer of the first conductivity type is shallower than the field isolation.

16. The OTP memory cell of claim 1 wherein said active area of the first conductivity type is deeper than the field isolation.

17. The OTP memory cell of claim 1 wherein the two adjacent word line gate poly and non-contacted active area between them are doped with the high-dose source/drain implant of the second conductivity type but not with the lightly-doped drain implant of the second conductivity type.

* * * * *